United States Patent
Noguchi et al.

(10) Patent No.: US 7,791,793 B2
(45) Date of Patent: Sep. 7, 2010

(54) SEMICONDUCTOR OPTICAL AMPLIFIER GATE SWITCH DRIVE CIRCUIT, SEMICONDUCTOR OPTICAL AMPLIFIER GATE SWITCHING DEVICE, AND OPTICAL CROSS CONNECT

(75) Inventors: Masaji Noguchi, Kawasaki (JP); Tomohiro Ueno, Kawasaki (JP); Yutaka Kai, Kawasaki (JP); Setsuo Yoshida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 219 days.

(21) Appl. No.: 12/002,763

(22) Filed: Dec. 19, 2007

(65) Prior Publication Data

US 2008/0205888 A1 Aug. 28, 2008

(30) Foreign Application Priority Data

Feb. 22, 2007 (JP) .............................. 2007-042871

(51) Int. Cl.
*H04J 14/02* (2006.01)
*G05F 1/00* (2006.01)
*H01S 5/00* (2006.01)

(52) U.S. Cl. ..................... 359/344; 327/518; 327/519; 327/520; 398/49; 398/50; 398/51

(58) Field of Classification Search ................. 359/344; 398/49, 50, 51; 327/518, 519, 520
See application file for complete search history.

(56) References Cited

U.S. PATENT DOCUMENTS

| 4,787,087 | A | * | 11/1988 | Hashimoto et al. | ........ | 372/38.02 |
| 5,712,591 | A | * | 1/1998 | Maag et al. | ................. | 330/84 |
| 6,323,717 | B1 | * | 11/2001 | Omura et al. | ............... | 327/434 |
| 6,590,448 | B1 | * | 7/2003 | Burt | .................... | 330/124 R |
| 2005/0141576 | A1 | * | 6/2005 | Ikeda et al. | ............. | 372/38.02 |

FOREIGN PATENT DOCUMENTS

| JP | 08-084122 | | 3/1996 |
| JP | 2508175 | | 5/1996 |
| JP | 2001-154160 | | 6/2001 |
| JP | 2008076554 A | * | 4/2008 |

* cited by examiner

*Primary Examiner*—Eric Bolda
(74) *Attorney, Agent, or Firm*—Staas & Halsey LLP

(57) ABSTRACT

A drive circuit is provided for a semiconductor optical amplifier type gate switch includes a first transmission path and a second transmission path. The first transmission path includes a common first sub-path between a signal source and a first node; and an individual second sub-path for each of a plurality of operational amplifiers between the first node and a corresponding one of the operational amplifiers. The second transmission path includes an individual third sub-path between each of the operational amplifiers and a second node; and a common fourth sub-path between the second node and the semiconductor optical amplifier type gate switches. Transmission delay times of all the individual second sub-paths are equal, and transmission delay times of all the individual third sub-paths are equal.

9 Claims, 9 Drawing Sheets

SEMICONDUCTOR OPTICAL AMPLIFIER GATE SWITCH DRIVE CIRCUIT, SEMICONDUCTOR OPTICAL AMPLIFIER GATE SWITCHING DEVICE, AND OPTICAL CROSS CONNECT

BACKGROUND OF THE INVENTION

1. Field of the Invention

The present invention relates to a semiconductor optical amplifier type gate switch drive circuit, a semiconductor optical amplifier type gate switching device, and an optical cross connect. In particular, the present invention relates to driving of the semiconductor optical amplifier type gate switching device.

2. Description of the Related Art

In recent years, in order to promote multi-media networks, there has been an urgent demand for developing speedy and larger capacity optical communication devices. As one approach to realize such optical communication devices, research and development are being made on ultra-high speed optical switches with switching time of nanosecond order. A semiconductor optical amplifier (SOA) type optical gate switching device is an example of such an ultra high speed optical switching device. The SOA type optical gate switching device is switched between ON and OFF based on a drive current output by a drive circuit. An operational amplifier that is capable of amplifying signals output from a signal generator is built in the drive circuit that outputs the drive current. A conventional technology has been disclosed in Japanese Patent Application Laid-open No. 2001-154160. Conventional operational amplifiers built in the drive circuit consists of a high-speed operational amplifier that is operable at 100 MHz of bandwidth, 1000 V per microsecond of the throughrate, 300 mA of the output (drive) current capacitance, and at 20 nanoseconds of the settling time.

Japanese Utility Model No. 2508175 discloses a parallel output synthesizing circuit that supplies electric power to an electric load comprising a large electric power by linking a plurality of amplifiers in parallel with each other.

To enhance the efficiency for transmission of optical packet signals, a still faster driving capability is demanded for the SOA type optical gate switching devices. Nevertheless, due to the conventional performance capability currently provided for any of conventional SOA type high-speed operational amplifiers, none of them has so far been able to satisfy the urgently demanded faster driving performance. Hence, as an alternative, it is one may think of using an SOA type operational amplifier capable of operating itself with a higher performance capability rated at 5000 V per microsecond and 150 mA of the output current capacitance operable at 1 GHz of bandwidth. However, when such a faster operational amplifier is used in an optical switching device, it is quite difficult for the optical switching device to satisfy 300 mA of the output current (drive current) capacitance currently being demanded.

To enhance the output current capacitance, taking a hint from Japanese Utility Model No. 2508175, one may think of connecting a plurality of operational amplifiers in parallel with each other. However, Japanese Utility Model No. 2508175 merely describes a method of supplying an increased amount of current to load in the parallel output synthesizing circuit as the main pursuing object without caring about the method of driving load at an increased rate at all.

SUMMARY OF THE INVENTION

It is an object of the present invention to at least partially solve the problems in the conventional technology.

According to an aspect of the present invention, there is provided a drive circuit for a semiconductor optical amplifier type gate switch that is connectable to an anode of each of a plurality of semiconductor optical amplifier type gate switches. The drive circuit includes a plurality of operational amplifiers that are connected in parallel with each other; a first transmission path that transmits a signal generated by a signal source to each of the operational amplifiers, wherein the first transmission path includes a common first sub-path that commonly transmits a signal from the signal source to a first node; and an individual second sub-path for each of the operational amplifiers that separately transmits the signal from the first node to a corresponding one of the operational amplifiers; and a second transmission path that transmits a signal output from the operational amplifiers to the semiconductor optical amplifier type gate switches, wherein the second transmission path includes an individual third sub-path for each of the operational amplifiers that separately transmits a signal from a corresponding one of the operational amplifiers to a second node; and a common fourth sub-path that commonly transmits the signal from the second node to the semiconductor optical amplifier type gate switches. Transmission delay times of all the individual second sub-paths are equal, and transmission delay times of all the individual third sub-paths are equal.

According to another aspect of the present invention, there is provided a semiconductor optical amplifier type gate switching device comprising a plurality of semiconductor optical amplifier type gate switches each having a cathode connected to ground and an anode connected to a drive circuit. The drive circuit includes a plurality of operational amplifiers that are connected in parallel with each other; a first transmission path that transmits a signal generated by a signal source to each of the operational amplifiers, wherein the first transmission path includes a common first sub-path that commonly transmits a signal from the signal source to a first node; and an individual second sub-path for each of the operational amplifiers that separately transmits the signal from the first node to a corresponding one of the operational amplifiers; and a second transmission path that transmits a signal output from the operational amplifiers to the semiconductor optical amplifier type gate switches, wherein the second transmission path includes an individual third sub-path for each of the operational amplifiers that separately transmits a signal from a corresponding one of the operational amplifiers to a second node; and a common fourth sub-path that commonly transmits the signal from the second node to the semiconductor optical amplifier type gate switches. Transmission delay times of all the individual second sub-paths are equal, and transmission delay times of all the individual third sub-paths are equal.

According to another aspect of the present invention, there is provided an optical cross connect comprising a plurality of semiconductor optical amplifier type gate switching devices each including a plurality of semiconductor optical amplifier type gate switches each having a cathode connected to ground and an anode connected to a drive circuit. The drive circuit includes a plurality of operational amplifiers that are connected in parallel with each other; a first transmission path that transmits a signal generated by a signal source to each of the operational amplifiers, wherein the first transmission path includes a common first sub-path that commonly transmits a signal from the signal source to a first node; and an individual second sub-path for each of the operational amplifiers that separately transmits the signal from the first node to a corresponding one of the operational amplifiers; and a second transmission path that transmits a signal output from the operational amplifiers to the semiconductor optical amplifier type gate switches, wherein the second transmission path includes an individual third sub-path for each of the operational amplifiers that separately transmits a signal from a corresponding one of the operational amplifiers to a second node; and a common fourth sub-path that commonly transmits the signal from the second node to the semiconductor optical amplifier type gate switches. Transmission delay times of all the individual second sub-paths are equal, and transmission delay times of all the individual third sub-paths are equal.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the SOA type optical gate switch drive circuit, the SOA type optical gate switching device, and the optical cross connect according to the present invention are concretely described below while referring to the accompanying drawings.

Figure 1:
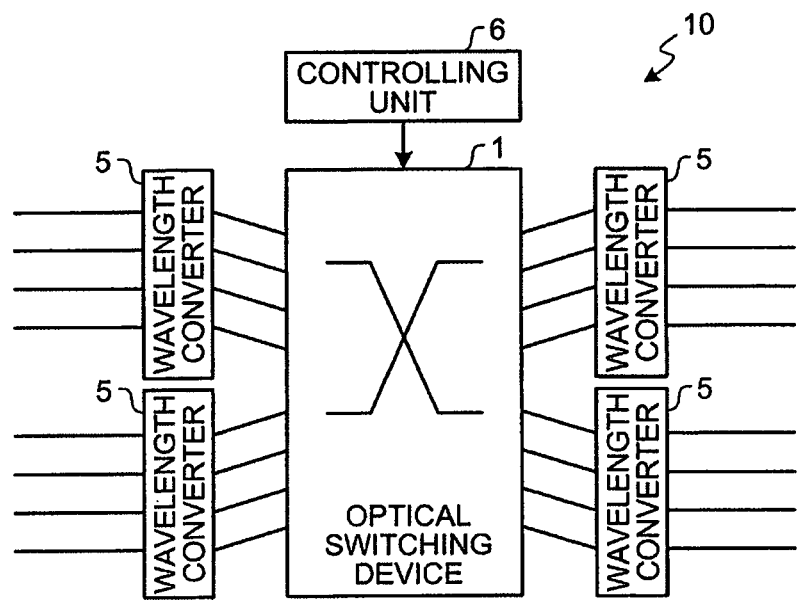
FIG. 1 is a schematic block diagram of an optical cross connect that configures an optical packet network according to an embodiment of the present invention.

First, actual configurations of an optical cross connect and an optical switching device according to an embodiment of the present invention are described below. FIG. 1 is a schematic block diagram of an optical cross connect 10 according to the embodiment. The optical cross connect 10 includes an optical switching device 1, a plurality of wavelength converters 5, and a controlling unit 6. The optical switching device 1 can be used in an optical packet distribution network. The optical switching device 1 incorporates a matrix optical switching function operable for switching optical paths of optical packet signals that are transmissible and receivable via the optical packet distribution network in which the optical switching device 1 is used.

Each of the wavelength converters 5 converts wavelength of a corresponding optical packet signal. The controlling unit 6 transmits a controlling signal to the optical switching device 1. The controlling signal specifies an output port from which a specific wavelength-converted optical packet signal is to be output. The controlling unit 6 determines the output port from the path information borne by the original optical packet signal. The optical switching device 1 switches an optical switch (see FIG. 2) after a predetermined offset time, also called as switching time, has elapsed from the moment when an optical packet (label) signal bearing the path information was received by the optical switching device 1. Such offset time functions as a safeguarding time for preventing the optical packet from adversely being affected. The switching time is set to 45 nanoseconds in the following embodiments; however, it can be set as desired.

Figure 2:
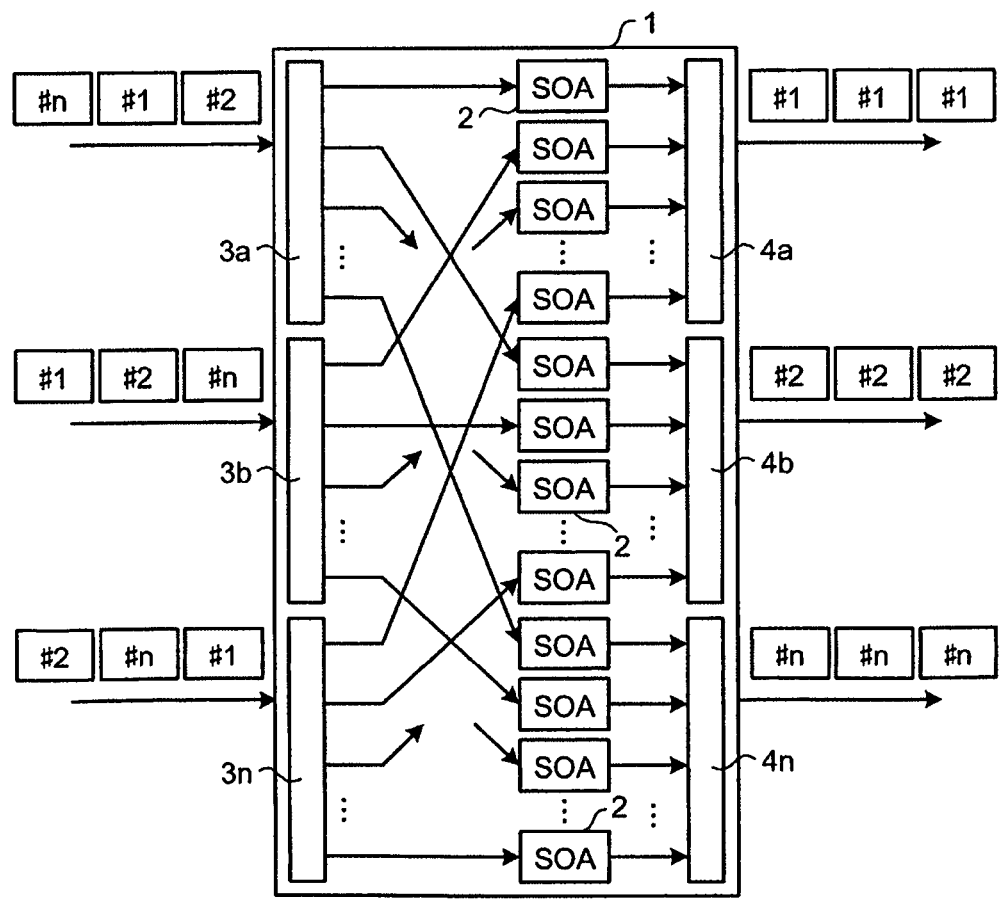
FIG. 2 is a detailed schematic block diagram of an optical switching device shown in FIG. 1.

FIG. 2 is a detailed schematic block diagram of the internal configuration of the optical switching device 1. The optical switching device 1 includes a plurality of SOA type optical gate switching devices 2, a plurality of optical couplers 3a, 3b, 3c, and a plurality of optical multiplexing couplers 4a, 4b, 4c. The optical couplers 3a, 3b, 3c will be collectively, or individually, referred to as an optical coupler 3, and the optical multiplexing couplers 4a, 4b, 4c will be collectively, or individually, referred to as an optical multiplexing coupler 4.

One optical coupler 3 is prepared for each input port. Each of the optical coupler 3 branches the optical packet signal input via the input port thereof to a number of optical packet signals that depends on the number of the output ports of the optical switching device 1. Each of the optical multiplexing coupler 4 causes optical packet signals output from a plurality of SOA type optical gate switching devices 2 to be coupled with each other. A group of SOA type optical gate switching devices includes a number of SOA type optical gate switching devices 2 equal to the number of the input ports. Each group consisting of these SOA type optical gate switching devices 2 is provided for individual output ports.

Figure 3:
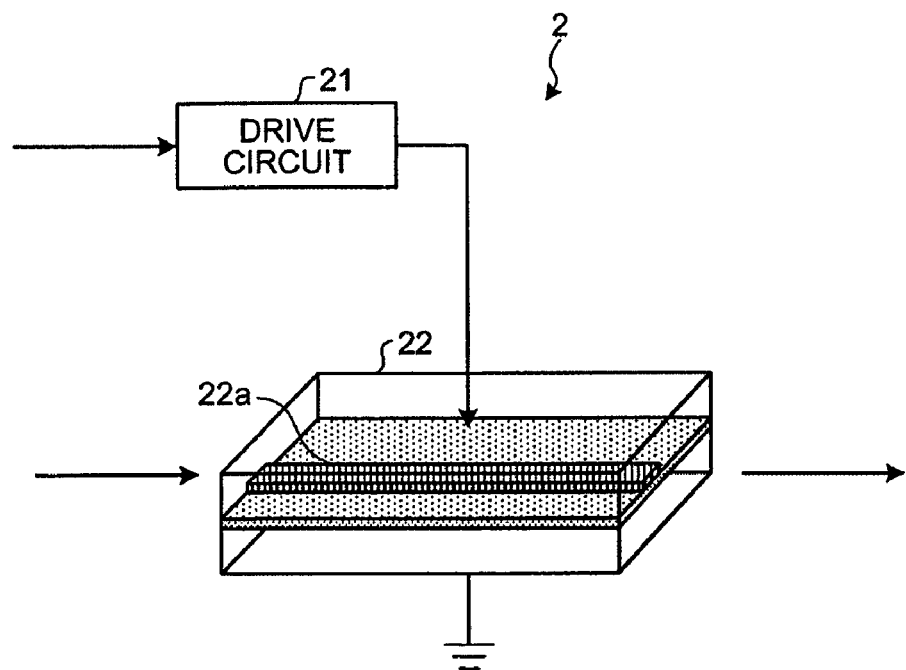
FIG. 3 is an exploded perspective view of an SOA type optical gate switching device.

FIG. 3 is an exploded perspective view of any one of the SOA type optical gate switching device 2. The SOA type optical gate switching device 2 includes a drive circuit 21 and an SOA type optical gate switch 22. The drive circuit 21 drives the SOA type gate switching device and it is connected to an anode of the SOA type optical gate switch 22. A cathode of the SOA type optical gate switch 22 is grounded. The SOA type optical gate switch 22 includes an optical signal amplifying area 22a.

Upon receiving a controlling signal from the controlling unit 6, the drive circuit 21 generates a drive signal and sends it to the SOA type optical gate switch 22.

When the drive signal reaches the optical signal amplifying area 22a, an input optical packet signal (see an arrow on the left of the optical signal amplifying area 22a) that has spread over the optical signal amplifying area 22a is amplified.

Hence, by properly controlling the timing of the drive current, it is possible to cause the SOA type optical gate switch 22 to function as a gate element for the optical packet signal. The SOA type optical gate switch 22 outputs the optical packet signal (see an arrow on the right of the optical signal amplifying area 22a) received via one of the optical couplers 3 in response to the drive signal that indicates the ON/OFF state of the drive current, and then the SOA type optical gate switch 22 transmits the optical packet signal to the corresponding optical multiplexing coupler 4.

More particularly, when the drive signal represents ON, the SOA type optical gate switch 22 is turned ON to cause the optical packet signal to be output. Conversely, when the drive signal represents OFF, the SOA type optical gate switch 22 is turned OFF, thereby causing the SOA type optical gate switch 22 to suspend the output of the optical packet signal. As described later on, however, leakage of light is inevitably generated to a certain extent even when the SOA type optical gate switch 22 is OFF.

Figure 4:
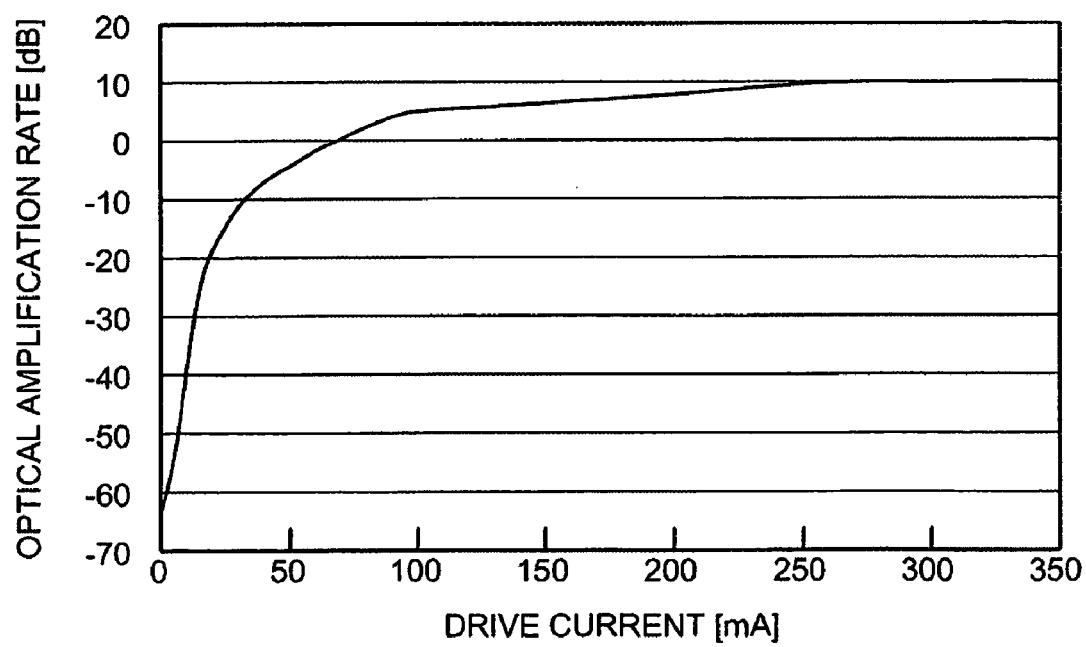
FIG. 4 is a graph for explaining the relationship between drive current and optical amplification rate.

FIG. 4 is a graph for explaining the relationship between the magnitude of drive current and optical amplification rate in the SOA type optical gate switch 22. The lateral axis represents drive current [mA], whereas the longitudinal axis represents optical amplification rate [dB]. As shown in FIG. 4, in the SOA type optical gate switch 22, the optical amplification rate varies depending on the magnitude of the drive current. Concretely, the optical amplification rate increases with an increase of the drive current. The optical amplification rate is about 10 dB for the drive current of 300 mA, thereby reaching the saturation level substantially. In other words, the optical amplification rate does not rise much even when the drive current is more than 300. On the other hand, when the drive current decreases, this in turn causes the light intensity tend to be attenuated.

Figure 5:
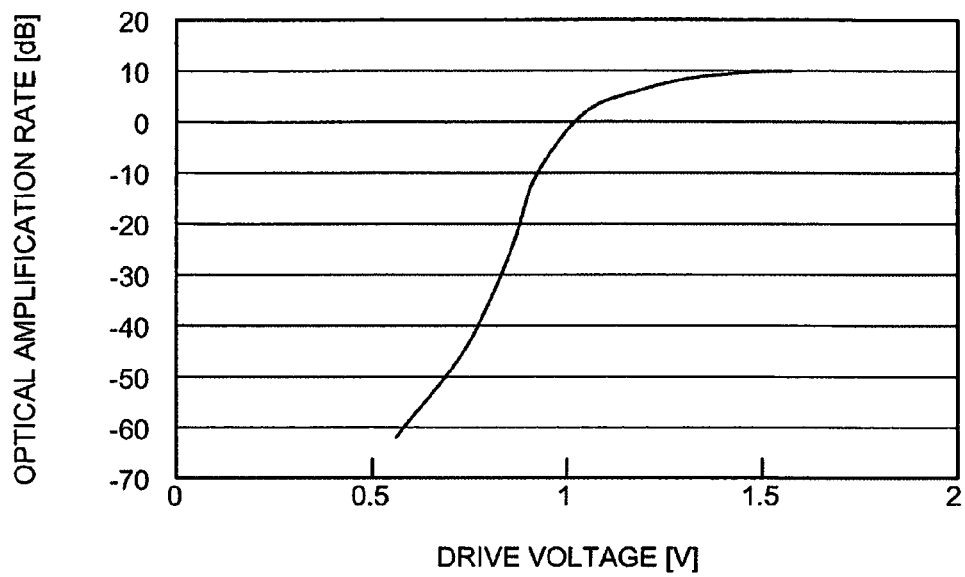
FIG. 5 is an another graph for explaining the relationship between drive current and optical amplification rate.

FIG. 5 is a graph for explaining the relationship between the voltage of drive current and optical amplification rate in the SOA type optical gate switch 22. In FIG. 5, the lateral axis represents drive voltage [V], whereas the longitudinal axis represents optical amplification rate [dB]. As shown in FIG. 5, in the SOA type optical gate switch 22 the optical amplification rate varies depending on the drive voltage. The SOA type optical gate switch 22 is driven by electric current in principle. However, by feeding a voltage from a power supply source that enables more than 300 mA of the drive current to flow through therein, it is also practicable to normally drive the SOA type optical gate switch 22 with a proper voltage. As shown in FIG. 5, the optical amplification rate increases with an increase of the drive voltage. By increasing the drive voltage up to approximately 1.5 V, approximately 10 dB of the optical amplification rate can be generated to reach the substantially saturated condition. Even when boosting the drive voltage to a level beyond 1.5 V, only a maximum of 10 dB of the optical amplification rate is obtainable. On the other hand, when the drive voltage decreases, this in turn causes the light intensity tend to be attenuated.

Figure 6:
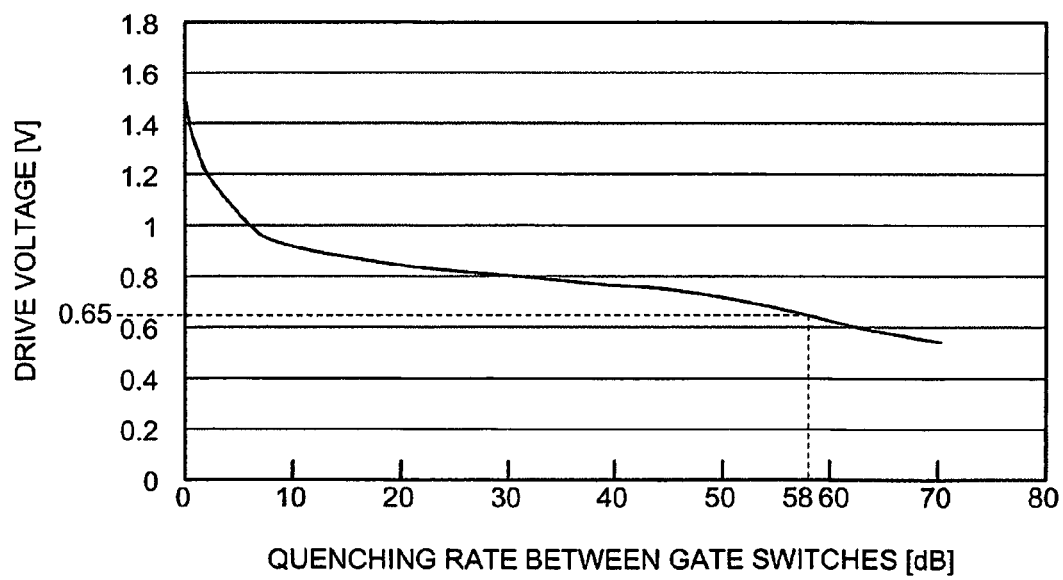
FIG. 6 is a graph for explaining the relationship between drive current and quenching rate between individual optical gate switching devices.

FIG. 6 is a graph for explaining the relationship between drive voltage and quenching rate between each of the gate switches in the SOA type optical gate switch 22. The quenching rate is a ratio of light intensities when an optical gate switch is in an ON state and when it is in an OFF state. The lateral axis shown in FIG. 6 represents the quenching rate [dB] between individual optical gate switches, whereas the longitudinal axis represents the drive voltage [V]. As shown in FIG. 6, the quenching rate decreases with an increase in the drive voltage. Rise of the quenching rate between individual optical gate switches indicates that the light leaked out from the turned-off optical gate switches has been intensified.

When the leaked light has been intensified, the light generates substantial cross-talk component. Hence, considering adverse influence caused by the cross-talk component of the light, it is necessary to properly regulate the drive voltage so as to secure the desired quenching characteristics. Concretely, when forming a matrix optical switch of eight input ports and eight output ports for example, approximately 58 dB of the quenching rate is required. In this example, the drive voltage must be below 0.65 V.

Referring now to FIG. 2, serial processes performed during a period ranging from the input of the optical packet signal to the SOA type optical switching device 1 up to the output thereof are described below. The following description solely refers to a situation in which an optical packet signal is output from a first input port to a second output port of the SOA type optical switching device 1. It is assumed that the SOA type optical switching device 1 incorporates "n" (where n is a positive integer) units of input ports and output ports. The first input port and the second output port can be any arbitrary ports. In this situation, path information related to the optical packet signal stores a code "#2" that specifies the second output port as the available output port.

Initially, an optical packet signal bearing path information "#2" is input via the first input port. In response, the optical coupler 3a corresponding to the first input port branches the optical packet signal into "n" units, and then transmits "n" units of optical packet signal to the SOA type optical gate switching device 2 available for the first input port that is provided for each of "n" units of the output port.

In the following step, based on the path information borne by the optical packet signal, the controlling unit 6 generates a controlling signal. During this process, a controlling signal is generated so as to instruct that the second output port be selected as the available output port. The controlling unit 6 transmits the controlling signal to each of the SOA type optical gate switching devices 2.

In the following step, based on the controlling signal transmitted from the controlling unit 6, the drive circuit 21 of the SOA type optical gate switching device 2 available for the second output port transmits the turned-ON signal to the SOA type optical gate switch 22. Hence, the optical packet signal bearing the path information "#2" is output from the SOA type optical gate switching device 2 available for the second output port. On the other hand, based on the controlling signal transmitted from the controlling unit 6, the drive circuit 21 of the SOA type optical gate switching device 2 available for any of output ports other than the second output port transmits the turned-off signal to the SOA type optical gate switch 22. Hence, the optical packet signal bearing the path information "#2" is prevented from being output from the SOA type optical gate switching device 2 other than the second output port.

In the following step, the optical packet signal output from the SOA type optical gate switching device 2 available for the second output port is further output from the second output port via a multiplexing coupler 4b. In other words, the optical packet signal bearing the path information "#2" is output solely through the second output port.

Figure 7:
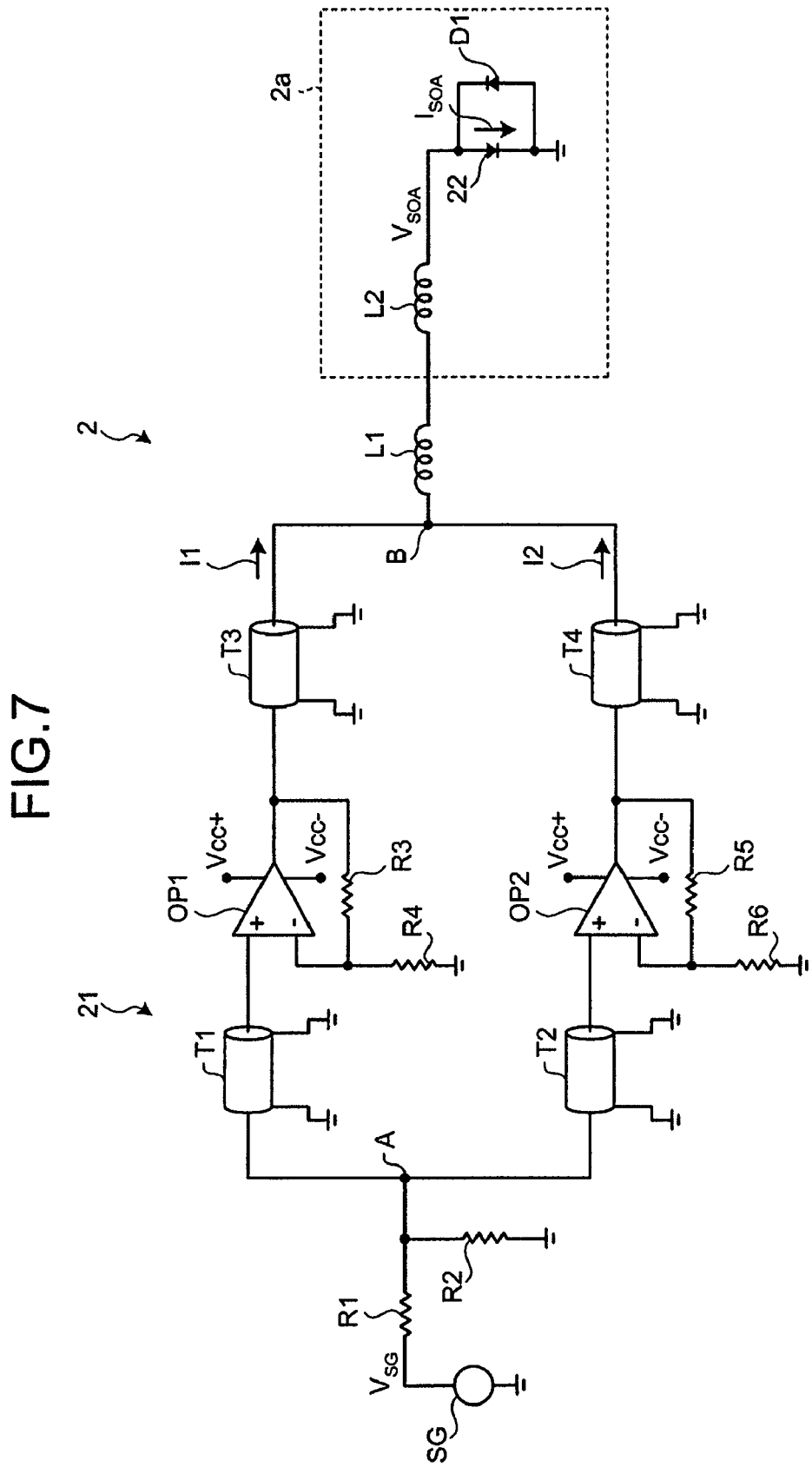
FIG. 7 is a circuit diagram of a SOA type optical gate switching device according to a first embodiment of the present invention.

FIG. 7 is a concrete circuit diagram of the circuitry built of the SOA type optical gate switching device 2. The drive circuit 21 drives an SOA type optical gate switch 22 by operating a couple of non-inverting high-speed operational amplifiers OP1 and OP2 that are connected in parallel with each other. A signal generator SG generates and outputs a rectangular signal waveform that turns the SOA type optical gate switch 22 ON and OFF. The rectangular signal waveform bears 0.6 V of potential while remaining ON and then turns into 0 V while remaining OFF. The rectangular signal waveform is input to non-inverting input terminals of the non-inverting high-speed operational amplifiers OP1 and OP2. Concretely, while the rectangular signal waveform turns ON, 0.3 V corresponding to one half the 0.6 V potential is input to the non-inverting input pins of the non-inverting high-speed amplifiers OP1 and OP2.

The non-inverting high-speed operational amplifiers OP1 and OP2 individually amplify the input rectangular signal waveform, and then convert this signal waveform into a drive signal before being output. Each of the non-inverting high speed operational amplifiers OP1 and OP2 is operable at 1 GHz of bandwidth and 5000 V/ms of the through-rate, and each has an output capacitance of 150 mA. The drive signals output from the non-inverting high-speed amplifiers OP1 and OP2 are respectively input to the SOA type optical gate switch 22. Concretely, the rectangular signal waveforms bearing 0.3 V of potential are respectively amplified and converted into drive signals each bearing 1.5 V of potential, which are then transmitted to the SOA type optical gate switch 22. An inductor L1 corresponds to a parasitic inductance in the substrate pattern of the drive circuit 21. The other inductor L2 corresponds to a parasitic inductance in a transmission path within an SOA type optical gate switch module 2a. The SOA type optical gate switch module 2a includes, apart from the inductor L2 and the SOA type optical gate switch 22, a Schottky barrier diode D1. The inductors L1 and L2 contain the electromagnetic sensitivity coefficient which is rated at 2 nH (nanohenry).

A couple of transmission path units T1 and T2 individually interlink a corresponding transmission route ranging from a node A up to corresponding non-inverting input terminals of the non-inverting high-speed operational amplifiers OP1 and OP2 so as to equalize the transmission delay time in the corresponding transmission routes. More particularly, within corresponding transmission routes that form parallel connections, the transmission path units T1 and T2 respectively form a couple of parallel transmission routes adjoining the signal generator SG across the node A as shown in FIG. 7. In order to equalize the transmission delay time, another approach is to interlink the parallel transmission routes by applying transmission wires comprising the same kind so that the length thereof can be equalized.

Another couple of opposite transmission path units T3 and T4 shown in FIG. 7 individually interlink the transmission routes that range from output terminals of the corresponding non-inverting high-speed operational amplifiers OP1 and OP2 up to the node B disposed between the transmission routes connected in parallel with each other. More particularly, within corresponding transmission routes that form parallel connections, the transmission path units T3 and T4 individually form transmission routes adjoining the SOA type optical gate switch 22 across the node B. In order to equalize the transmission delay time, another approach is to interlink the parallel transmission routes by applying transmission wires comprising the same kind so that the length of individual transmission routes can be equalized.

Transmission delay time in the transmission paths T1 to T4 is regulated at 20 picoseconds, while the characteristic impedance value is regulated at 50Ω. When the length of the transmission routes shown in FIG. 7 is regulated to be 3 mm, transmission delay time becomes approximately 20 picoseconds. As described above, by equalizing the transmission delay time through the transmission path units T1 to T4 on the part of the input and output terminal of the non-inverting high-speed operational amplifiers OP1 and OP2, it is possible to prevent signal phase from being shifted otherwise caused by the difference in the transmission delay, thus further preventing signal waveforms from incurring unwanted strain.

The Schottky barrier diode D1 functions to prevent the ringing from occurrence during the fall of the drive signal (drive voltage). When the SOA type optical gate switch 22 shifts from the turned-on state to the turned-off state, charge stored in the parasitic capacitor of the SOA type optical gate switch 22 is discharged to result in the generation of back electromotive force caused by the inductance L1 and L2, thereby causing the ringing to be generated on the negative side. Hence, presence of the Schottky barrier diode D1 at the position opposite from the SOA type optical gate switch 22 as shown in FIG. 7 prevents occurrence of the ringing.

More particularly, a cathode of the Schottky barrier diode D1 is connected to the anode of the SOA type optical gate switch 22, whereas an anode of the Schottky barrier diode D1 is connected to the cathode of the SOA type optical gate switch 22. With this arrangement, the drive current does not flow in the direction of the Schottky barrier diode D1 while the SOA type optical gate switch 22 remains ON, but the drive current flows in the direction of the SOA type optical gate switch 22 unilaterally. Conversely, while the SOA type optical gate switch 22 remains OFF, charge stored in the parasitic capacitor of the SOA type optical gate switch 22 flows in the direction of the Schottky barrier diode D1, thereby preventing the back electromotive force from occurrence otherwise caused by the inductance L1 and L2. In consequence, undershoot is prevented from occurrence. This in turn prevents igneous meteor from being generated in the SOA type optical gate switching device otherwise caused by occurrence of the ringing.

A silicon (Si) type Schottky barrier diode, or a gallium arsenide (GaAs) composite type Schottky barrier can be employed as the Schottky barrier diode D1. Because the silicon type Schottky barrier diode contains the forward voltage by an extent less than that of any conventional diode, a greater effect can be secured for preventing occurrence of the ringing. On the other hand, because it is possible for the GaAs composite type Schottky barrier diode to contract the junction capacitance to an extent below that of the silicon type Schottky barrier diode, faster response can be secured. Hence, the GaAs composite type Schottky barrier diode is better suited for enhancing practical effect for preventing the ringing from occurrence.

A plurality of resistors R1, R2, R4, and R6 shown in FIG. 7 are respectively rated at 50Ω of resistance value, whereas resistors R3 and R5 are respectively rated at 200Ω of resistance value.

Figure 8:
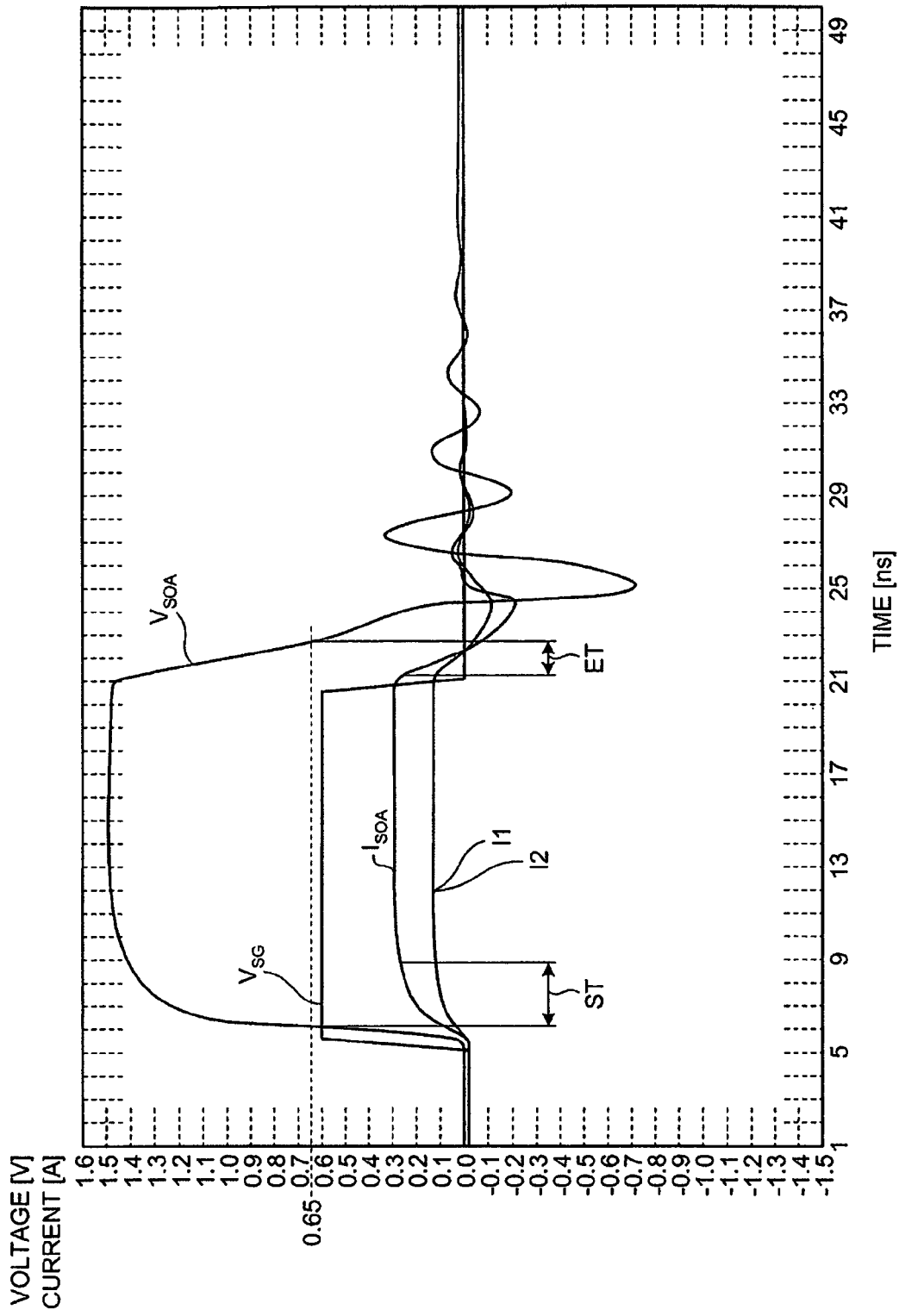
FIG. 8 is a schematic diagram for explaining the operation performed by the SOA type optical gate switching device shown in FIG. 7.

FIG. 8 is a schematic diagram for explaining the operations performed by the optical switching device 1. The schematic diagram shown in FIG. 8 is explanatory of waveforms of voltages and current in the course of operations performed by the SOA type optical switching device shown in FIG. 7. $V_{SG}$ is a voltage waveform output from the signal generator SG. The voltage waveform $V_{SG}$ is a rectangular signal waveform, which bears 0.6 V of potential while remaining ON and then becomes 0 V when being turned OFF. $V_{SOA}$ is a linear voltage waveform output from the drive circuit 21. The linear voltage waveform $V_{SOA}$ corresponds to a drive signal that drives the SOA type optical gate switch 22, which bears 1.5 V of potential while remaining ON and then becomes 0 V when being turned OFF. I1 represents a current waveform output from the non-inverting high-speed operational amplifier OP1, whereas I2 represents a current waveform output from the other non-inverting high-speed operational amplifier OP2. As shown in FIG. 8, the current waveforms I1 and I2 are identical. $I_{SOA}$ represents the current that flows into the SOA type optical gate switch 22, which is converted into a current waveform after being combined with the current waveforms I1 and I2.

It is so defined that the rise time corresponds to a period of time required for enabling the actual value of current flowing through the SOA type optical gate switch 22 to reach 270 mA of the output current capacitance that corresponds to 90% against 300 mA of the normal capacitance of current flowing through the SOA type optical gate switch 22 after enabling the voltage for driving the SOA type optical gate switch 22 to reach 0.65 V of potential that is quite enough to satisfy the quenching characteristics. Furthermore, it is so defined that the fall time corresponds to a period of time required for enabling the drive voltage for driving the SOA type optical gate switch 22 to be lowered to 0.65 V of potential that is enough to satisfy the quenching characteristics after causing the value of current flowing through the SOA type optical gate switch 22 to be lowered to 270 mA of the output current capacitance that corresponds to 90% against 300 mA of the normal capacitance of the current flowing through the SOA type optical gate switch 22.

As shown in FIG. 8, the rise time ST is rated at approximately 3 nanoseconds, whereas the fall time is rated at about 1.5 nanoseconds. Hence, the sum of the rise time and the fall time becomes approximately 4.5 nanoseconds, which is approximately one third that is summed up by any of conventional arts to be described in the following paragraphs. In other words, the optical switching device 1 can secure an extremely fast operating speed much faster than that of any of corresponding conventional arts by three times.

Figure 11:
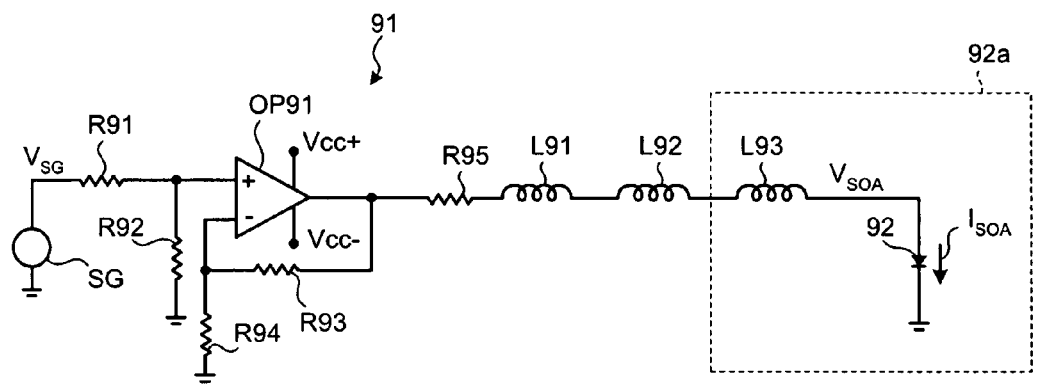
FIG. 11 is a circuit diagram of a conventional SOA type optical gate switching device.

Conventional arts are described below. FIG. 11 is a circuit diagram of a conventional SOA type optical gate switching device. A drive circuit 91 drives an SOA type optical gate switch 92 by operating a non-inverting high speed operational amplifier OP91. A signal generator SG generates a rectangular signal waveform that causes the SOA type optical gate switch 92 to be turned ON and OFF, and then outputs the rectangular signal waveform. The rectangular signal waveform bears 3.09V of potential while remaining ON and then becomes 0V when being turned OFF. This signal waveform is input to a non-inverting input terminal of the non-inverting high-speed operational amplifier OP91, which then amplifies the input rectangular signal waveform and then converts the amplified rectangular signal waveform into a drive signal, which is then transmitted to the SOA type optical gate switch 92. The non-inverting high-speed operational amplifier OP91 is operable at 100 MHz of bandwidth, 1000 V per microsecond of the through-rate, 300 mA of the output current capacitance, and at 20 nanosecond of the settling time. The drive signal output from the non-inverting high-speed operational amplifier OP91 is input to the SOA type optical gate switch 92.

An inductor L91 prevents an overshoot from occurrence during the rise time. Another inductor L92 corresponds to a parasitic inductance in the substrate pattern of the drive circuit 91. The other inductor L93 corresponds to a parasitic inductance in a transmission path within an SOA type optical gate switch module 92a. A resistor R95 inhibits the ringing from occurrence during the rise time. The inductor L92 shown in FIG. 11 contains 38 nH (nanohenry) of the electromagnetic sensitivity coefficient, whereas the inductors L92 and L93 respectively contain 2 nH thereof. Resistors R91, R92, and R94, are respectively rated at 50Ω of resistance value, whereas resistor R93 is rated at 200Ω. Resistor R95 is solely rated at 20Ω of resistance value.

Figure 12:
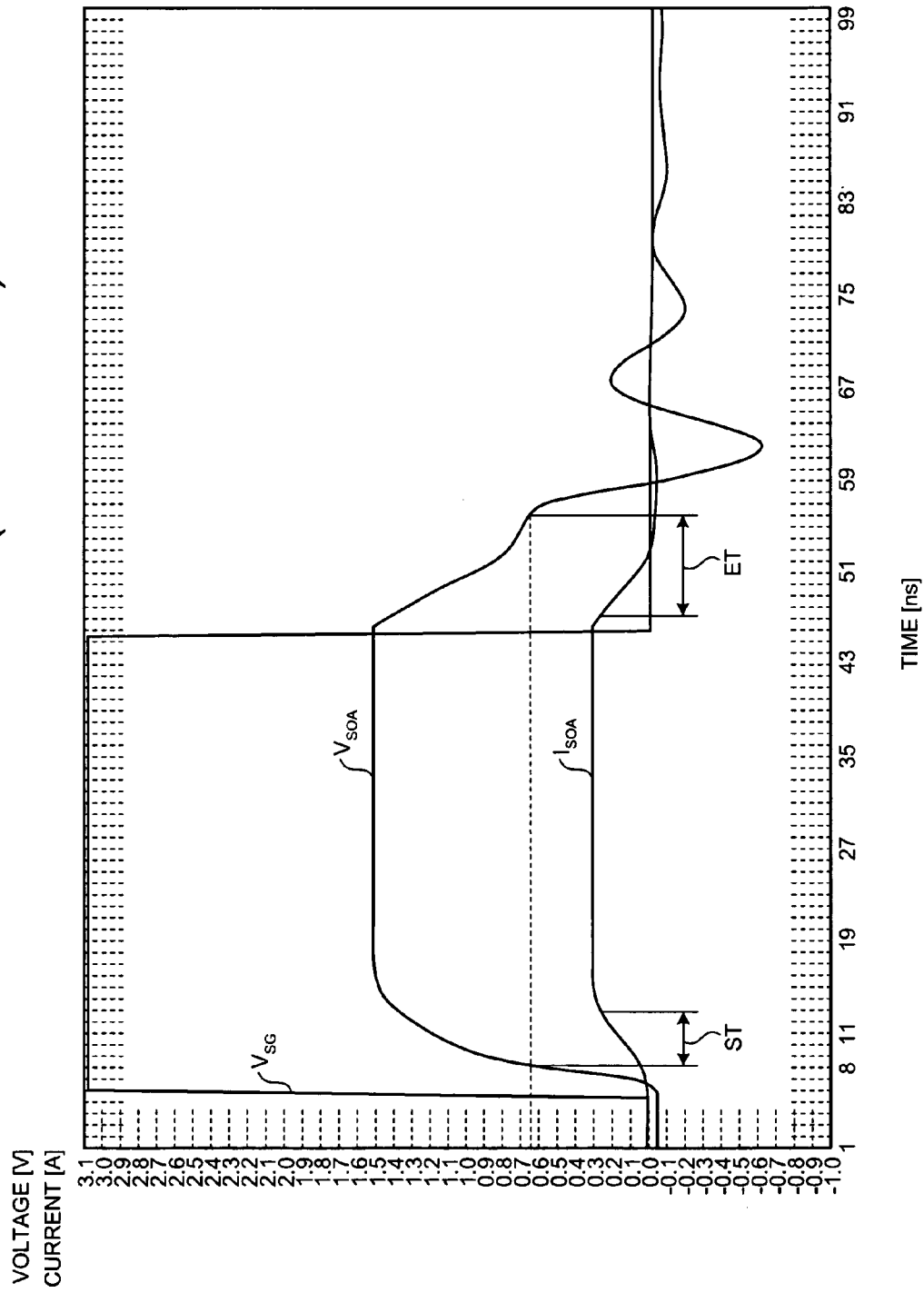
FIG. 12 is a schematic diagram for explaining the operation performed by the conventional SOA type optical gate switching device shown in FIG. 11.

FIG. 12 is a graph for explaining the operations performed by the conventional SOA type optical gate switching device and waveforms of voltages and current in the course of operating the conventional SOA type optical gate switching device shown in FIG. 11. Mark $V_{SG}$ designates a voltage waveform output from the signal generator SG. This voltage $V_{SG}$ consists of a rectangular signal waveform, which bears 3.09 V of potential while remaining ON and becomes 0 V when being turned OFF. Mark $V_{SOA}$ designates a drive signal that drives the SOA type optical gate switch 92, which bears 1.5 V of potential while remaining ON and becomes 0 V when being turned OFF. The voltage waveform $V_{SOA}$ corresponds to a drive signal that drives the SOA type optical gate switch 92, which bears 1.5 V of potential and becomes 0 V when being turned OFF. The other mark $I_{SOA}$ designates a current waveform output from the non-inverting high-speed operational amplifier OP91.

As shown in FIG. 12, in the conventional SOA type optical gate switching device, the rise time ST approximates 5 nanoseconds and the fall time ET approximates 9 nanoseconds. Hence, the sum of the rise time and the fall time becomes approximately 14 nanoseconds, which in turn indicates that the summed value corresponds to three times the summed value on the part of the optical switching device 1. In other words, the conventional SOA type optical gate switching device requires a longer time for the rise and fall of the drive voltage by three times against that is achieved by the optical switching device 1.

In the conventional SOA type optical gate switching device shown in FIG. 11, ringing is prevented from occurrence by disposing the resistor R95 bearing 20Ω of resistance value between the output ports of the non-inverting high-speed operational amplifier OP91 and the SOA type optical gate switch 92. Nevertheless, due to provision of the resistor R95, the non-inverting high-speed operational amplifier OP91 requires a large amount of output voltage rated at 7.7 V, thus resulting in the increased power consumption on the part of the drive circuit 91. When using 300 mA of the output current capacitance, the resistor R95 bearing 20Ω of resistance value consumes 1.8 W of electric power. Further, due to the needs for enlarging the dimensions of the resistor R95 that requires much power to be consumed, the circuitry is inevitably expanded. Further, because the non-inverting high-speed operational OP91 outputs a very high voltage, it is not possible to use any operational amplifier that is operable at a faster speed, thus obliging the gate switching device to use a conventional operational amplifier that merely exerts a settling performance at approximately 20 nanoseconds, thus resulting in the obstruction to achieve a faster operability.

In contrast with the conventional SOA type optical gate switching device, the optical switching device 1 enables the drive voltage to rise at approximately 3 nanoseconds and fall at approximately 1.5 nanoseconds, thus summing up the rise and fall periods to be approximately 4.5 nanoseconds. This in turn indicates that the optical switching device 1 is operable at an ultra-high speed much faster than that is practicable by any of conventional SOS type optical gate switching devices by three times. This is due to the provision of a couple of non-inverting high-speed operational amplifiers OP2 and OP2 that are connected in parallel with each other. More particularly, because the through-rates of drive voltage output from the non-inverting high-speed operational amplifiers OP1 and OP2 disposed in parallel are added up, the resultant through rate approximates double. This in turn causes the rise time of the drive current to be decreased approximately by one half from that has so far been achieved by any conventional circuitry. In other words, the drive current generated in the operational amplifiers OP1 and OP2 rises at a rate faster than that has so far been achieved by any conventional operational amplifiers by double. On the other hand, regarding the fall time, due to presence of the parasitic capacitance in the SOA type optical gate switch 22, electric charge borne therein during the actuated period is quickly absorbed by a couple of non-inverting high-speed operational amplifiers OP1 and OP2 respectively linked in parallel with each other. This in turn causes the drive voltage to be lowered at a rate much faster than that is practicable by any of conventional circuits that merely consists of a single unit of non-inverting high-speed operational amplifier OP91 for example, thereby securely contracting the fall time of the drive voltage.

The optical switching device 1 dispenses with the provision of the resistor R95 bearing 20Ω of resistance value provided for any of conventional SOA type optical gate switching devices, thereby resulting in the reduction of consumable electric power. Although the optical switching device 1 causes the built-in component elements to generate substantial heat via a large-capacitance current corresponding to 300 mA like any conventional SOA type optical gate switching device, because the thermally generated volume can fully be dispersed into a couple of non-inverting high-speed operational amplifiers OP1 and OP2, it is possible to enhance the thermal dispersion efficiency on the part of a driver amplifier.

In the first embodiment, although the rectangular signal waveform is solely generated by the signal generator SG, practical means for generating the rectangular signal waveform is not solely limited to the signal generator SG, but it is also practicable to generate the rectangular signal waveform by applying a field programmable gate array (FPGA) or a logic buffer circuit for example.

A second embodiment of the present invention is described below. With reference to the difference caused by the configuration of the inventive SOA type optical gate switching device related to the first embodiment, instead of the non-inverting high-speed operational amplifiers OP1 and OP2 incorporated in the drive circuit of the first embodiment, the second embodiment introduces a couple of inverting type high-speed operational amplifiers. Except for this change, the second embodiment uses component elements that are exactly identical to those which are adopted for implementing the first embodiment. Hence, individual component elements are merely cited by reference numerals identical to those which are provided for the corresponding component elements adopted for the first embodiment, and so, concrete description thereof is deleted here. The main difference from the first embodiment is described below.

Figure 9:
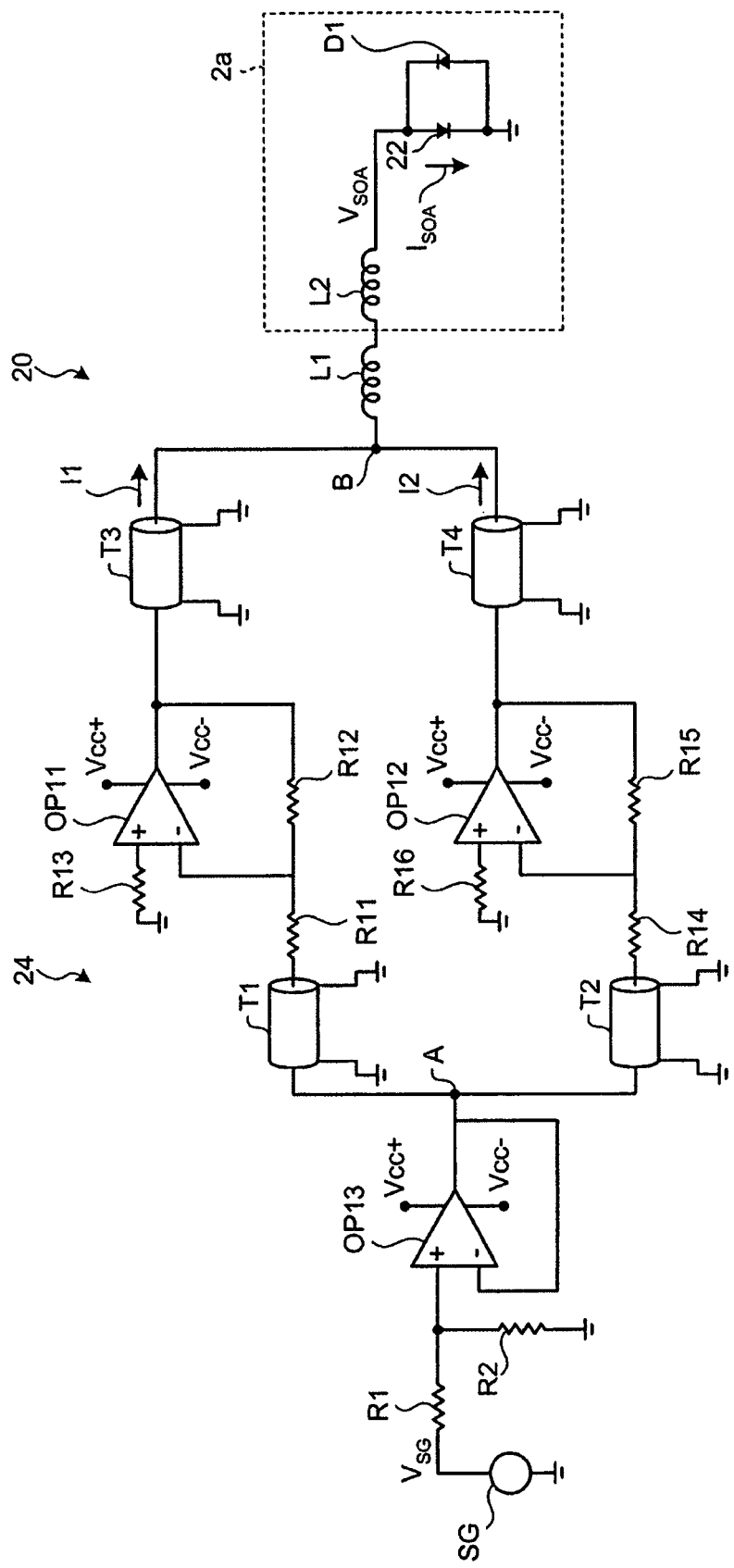
FIG. 9 is a circuit diagram of a SOA type optical gate switching device according to a second embodiment of the present invention.

FIG. 9 is a circuit diagram of the circuitry of an SOA type optical gate switching device 20 according to the second embodiment. The SOA type optical gate switching device 20 can be used instead of the SOA type optical gate switching device 2 in FIG. 2. A drive circuit 24 is used to drive the SOA type optical gate switch 22 shown in FIG. 3 instead of the drive circuit 21 by operating a couple of inverting type high-speed operational amplifiers OP11 and OP12. The signal generator SG generates a rectangular signal waveform that causes the SOA type optical gate switch 22 to be turned ON and OFF, and then outputs the rectangular signal waveform to inverted input terminals of the inverting type high-speed operational amplifiers OP11 and OP12 via a voltage follower circuit OP12. The rectangular signal waveform remains at −0.6 V of potential while being turned ON and then becomes 0 V when being turned OFF. More particularly, while the rectangular signal waveform turns ON, −0.3 V of potential corresponding to one half the −0.6 potential is routed to inverted input pins of the inverting high-speed operational amplifiers OP11 and OP12.

The inverting high-speed operational amplifiers OP11 and OP12 individually amplify the input rectangular signal waveform, and then converts the amplified rectangular signal waveform into a drive signal, which is then input to the SOA type optical gate switch 22. The inverting high-speed operational amplifiers OP11 and OP12 are respectively operable at 1 GHz of bandwidth, 5000 V per microsecond of the through-rate, and preserves 150 mA of the output current capacitance. Concretely, the inverting high-speed operational amplifiers OP11 and OP12 individually amplify the rectangular signal waveform bearing −0.3 V of potential so as to convert the amplified rectangular signal waveform into a drive signal, which is then input to the SOA type optical gate switch 22. Inductance L1 corresponds to the parasitic inductance in the substrate pattern of the drive circuit 24. The other inductance L2 corresponds to the parasitic inductance through a transmission path within SOA type optical gate switch module 2a. The inductances L1 and L2 shown in FIG. 9 are respectively provided with 2 nH (nanohenry) of the electromagnetic sensitivity coefficient.

In order to equalize the transmission delay time in the transmission path units T1 and T2 disposed at opposite positions on the part of the signal generator SG across the node A shown in FIG. 9, the transmission path units T1 and T2 jointly interlink the parallel routes ranging from the node A up to the inverted input terminals of a couple of inverting high speed operational amplifiers OP11 and OP12. Another approach is to equalize the transmission delay time by equalizing the length of a couple of parallel transmission lines comprising the same kind. Likewise, in order to equalize the transmission delay time in the transmission path units T3 and T4 disposed at parallel positions on the part of the SOA type optical gate switch 22 across the node B, another approach is to cause a couple of transmission wires comprising the same kind to interlink the parallel transmission path units T3 and T4 within an extent that ranges from output terminals of the inverting high speed operational amplifiers OP11 and OP12 up to the node B.

Transmission delay time through the transmission path units T1 to T4 shown in FIG. 9 is regulated to be 20 picoseconds, in which characteristic impedance is regulated at 50Ω. Note that, when the transmission delay time is restricted within 20 picoseconds, length of the transmission line is defined to be 3 mm. By equalizing the transmission delay time through the transmission path units T1 to T4 on the part of the input and output terminals of a couple of inverting high speed operational amplifiers OP11 and OP12, actual phases of signal can be prevented from incurring unwanted shift otherwise caused by the transmission delay time through the transmission lines, thereby further enabling to prevent signal waveforms from incurring unwanted strain.

Because the Schottky barrier diode D1 shown in FIG. 9 has functional characteristics identical to those which have been described earlier with reference to the first embodiment, further description is omitted from here. The resistors R1 and R2 shown in FIG. 9 are respectively rated at 50Ω. Resistors R11 and R14 are respectively rated at 100Ω. Resistors R12 and R15 are respectively rated at 500Ω. Resistors R13 and R16 are rated at 120Ω.

Figure 10:
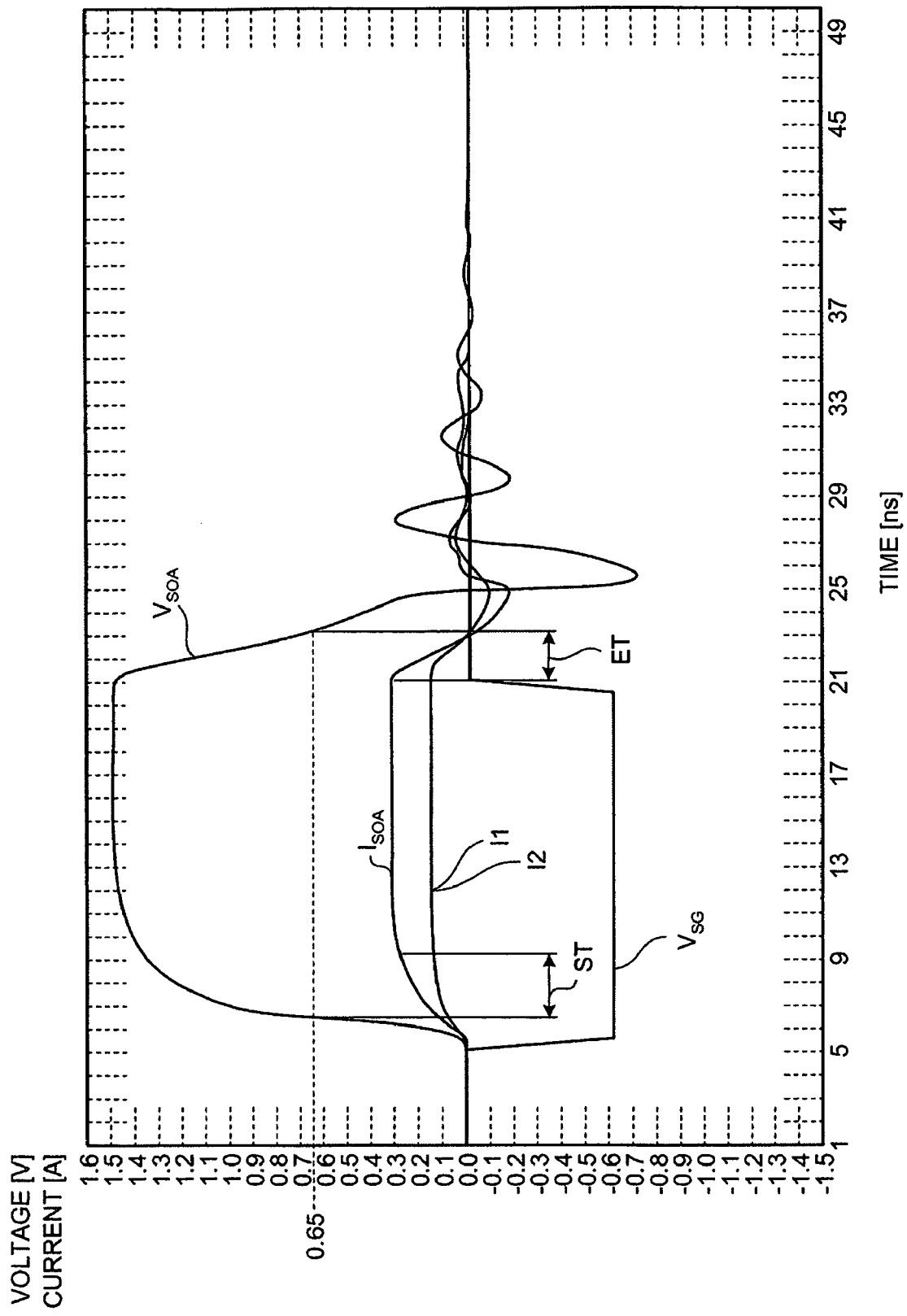
FIG. 10 is a schematic diagram for explaining the operation performed by the SOA type optical gate switching device shown in FIG. 9.

FIG. 10 is a graph for explaining the operations performed by the SOA type optical gate switching device 20. The graph shown in FIG. 10 represents transitional waveforms generated by individual voltages and current in the course of operating the SOA type optical gate switching device 20. Mark $V_{SG}$ designates a rectangular voltage waveform output from the signal generator SG, which bears −0.6 V of potential while remaining ON and then becomes 0V when being turned OFF.

Mark $V_{SOA}$ designates a curved voltage waveform output from the drive circuit 21. The voltage waveform $V_{SOA}$ corresponds to a drive signal that drives the SOA type optical gate switch 22, which bears 1.5 V of potential while remaining ON and then becomes 0 V when being turned OFF. Mark I1 designates a linear current waveform output from the inverting high speed operational amplifier OP11. Mark I2 designates a linear current waveform output from the inverting high speed operational amplifier OP12. As shown in FIG. 10, the current waveforms I1 and I2 are designated by an identical linear state. Mark $I_{SOA}$ designates a curved current waveform generated via a combination of the current waveforms I1 and I2.

As shown in FIG. 10, the rise time ST of the drive voltage/current approximates 3.3 nanoseconds, whereas the fall time ET thereof approximates 2.3 nanoseconds, thereby summing up to approximately 5.6 nanoseconds. This value approximates two fifth the summed value on the part of a corresponding conventional art. In other words, the SOA type optical gate switching device 20 can securely achieve high speed operations faster than that has so far been achieved by any conventional art by approximately 2.5 times.

In the first and second embodiments, a couple of operational amplifiers are connected in parallel with each other. However, the scope of the present invention is not solely limited to the provision of a couple of operational amplifiers, but three or more than three of operational amplifiers may also be connected in parallel with each other.

According to an aspect of the present invention, it is possible to increase the output current capacitance and the rise rate of the drive signal. Furthermore, load charged in the actuated SOA type optical gate switching device can be absorbed at a faster rate when the voltage declines. This in turn causes the voltage to be lowered at a rate much faster than the case of a circuit merely consisting of an operational amplifier and further causes the breaking time to be contracted. Furthermore, by equalizing the transmission delay time in the transmission lines connected up to the node or the node on the part of the signal source of operational amplifiers connected in parallel with each other and on the part of the optical gate switch, phases of signals can be prevented from incurring shift otherwise caused by the difference generated by a delay in the transmission lines, thus further preventing signal waveforms from incurring unwanted strain.

Further, while the SOA type optical gate switching device remains ON, drive current is prevented from flowing in the direction of a Schottky barrier diode, but instead, the drive current flows in the direction of the SOA type optical gate switching device unilaterally. On the other hand, while the SOA type optical gate switching device remains OFF, because the SOA type optical gate switching device is connected to the Schottky barrier diode in order to enable the charge remaining in the parasitic capacitor to flow in the direction of the Schottky barrier diode, it is possible to prevent the charge remaining in the parasitic capacitor from flowing in the direction of the drive circuit, thereby deterring the ringing from occurrence.

Moreover, it is possible to effectively drive the SOA type optical gate switching device at an ultra-high speed while properly maintaining the rated capacitance of the drive current supplied to the SOA type optical gate switching device.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A drive circuit for a semiconductor optical amplifier gate switch that is connectable to an anode of each of a plurality of semiconductor optical amplifier gate switches, the drive circuit comprising:
    a plurality of operational amplifiers that are connected in parallel with each other;
    a first transmission path that transmits a signal generated by a signal source to each of the operational amplifiers, wherein the first transmission path includes
        a common first sub-path that commonly transmits a signal from the signal source to a first node; and
        an individual second sub-path for each of the operational amplifiers that separately transmits the signal from the first node to a corresponding one of the operational amplifiers; and
    a second transmission path that transmits a signal output from the operational amplifiers to the semiconductor optical amplifier gate switches, wherein the second transmission path includes
        an individual third sub-path for each of the operational amplifiers that separately transmits a signal from a corresponding one of the operational amplifiers to a second node; and
        a common fourth sub-path that commonly transmits the signal from the second node to the semiconductor optical amplifier gate switches, wherein
    transmission delay times of all the individual second sub-paths are equal, and transmission delay times of all the individual third sub-paths are equal.

2. The drive circuit according to claim 1, wherein the operational amplifiers include non-inverting operational amplifiers.

3. The drive circuit according to claim 1, wherein the operational amplifiers include inverting operational amplifiers.

4. A semiconductor optical amplifier gate switching device comprising a plurality of semiconductor optical amplifier gate switches each having a cathode connected to ground and an anode connected to a drive circuit, wherein the drive circuit includes
    a plurality of operational amplifiers that are connected in parallel with each other;
    a first transmission path that transmits a signal generated by a signal source to each of the operational amplifiers, wherein the first transmission path includes
        a common first sub-path that commonly transmits a signal from the signal source to a first node; and
        an individual second sub-path for each of the operational amplifiers that separately transmits the signal from the first node to a corresponding one of the operational amplifiers; and
    a second transmission path that transmits a signal output from the operational amplifiers to the semiconductor optical amplifier gate switches, wherein the second transmission path includes
        an individual third sub-path for each of the operational amplifiers that separately transmits a signal from a corresponding one of the operational amplifiers to a second node; and
        a common fourth sub-path that commonly transmits the signal from the second node to the semiconductor optical amplifier gate switches, wherein
    transmission delay times of all the individual second sub-paths are equal, and transmission delay times of all the individual third sub-paths are equal.

5. The semiconductor optical amplifier gate switching device according to claim 4, wherein the operational amplifiers include non-inverting operational amplifiers.

6. The semiconductor optical amplifier gate switching device according to claim 4, wherein the operational amplifiers include inverting operational amplifiers.

7. The semiconductor optical amplifier gate switching device according to claim 4, further comprising a Schottky barrier diode, wherein a cathode of the Schottky barrier diode is connected to the anode of each semiconductor optical amplifier gate switch, and an anode of the Schottky barrier diode is connected to the cathode of each of the semiconductor optical amplifier gate switches.

8. An optical cross connect comprising a plurality of semiconductor optical amplifier gate switching devices each including a plurality of semiconductor optical amplifier gate switches each having a cathode connected to ground and an anode connected to a drive circuit, wherein the drive circuit includes
 a plurality of operational amplifiers that are connected in parallel with each other;
 a first transmission path that transmits a signal generated by a signal source to each of the operational amplifiers, wherein the first transmission path includes
  a common first sub-path that commonly transmits a signal from the signal source to a first node; and
  an individual second sub-path for each of the operational amplifiers that separately transmits the signal from the first node to a corresponding one of the operational amplifiers; and
 a second transmission path that transmits a signal output from the operational amplifiers to the semiconductor optical amplifier gate switches, wherein the second transmission path includes
  an individual third sub-path for each of the operational amplifiers that separately transmits a signal from a corresponding one of the operational amplifiers to a second node; and
  a common fourth sub-path that commonly transmits the signal from the second node to the semiconductor optical amplifier gate switches, wherein
 transmission delay times of all the individual second sub-paths are equal, and transmission delay times of all the individual third sub-paths are equal.

9. The optical cross connect according to claim 8, further comprising a Schottky barrier diode, wherein a cathode of the Schottky barrier diode is connected to the anode of each semiconductor optical amplifier gate switch, and an anode of the Schottky barrier diode is connected to the cathode of each of the semiconductor optical amplifier gate switches.

* * * * *